United States Patent
Shi et al.

(10) Patent No.: US 12,266,621 B2
(45) Date of Patent: Apr. 1, 2025

(54) DISPLAY PANEL, METHOD OF MANUFACTURING DISPLAY PANEL, AND DISPLAY DEVICE

(71) Applicant: TCL CHINA STAR OPTOELECTRONICS TECHNOLOGY CO., LTD., Guangdong (CN)

(72) Inventors: Jinming Shi, Guangdong (CN); Huiru Zhao, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/622,229

(22) PCT Filed: Dec. 16, 2021

(86) PCT No.: PCT/CN2021/138736
§ 371 (c)(1),
(2) Date: Dec. 22, 2021

(87) PCT Pub. No.: WO2023/097793
PCT Pub. Date: Jun. 8, 2023

(65) Prior Publication Data
US 2024/0038697 A1 Feb. 1, 2024

(30) Foreign Application Priority Data
Dec. 2, 2021 (CN) .................. 202111460450.5

(51) Int. Cl.
*H01L 23/48* (2006.01)
*H01L 23/00* (2006.01)
*H01L 25/16* (2023.01)

(52) U.S. Cl.
CPC .............. *H01L 24/05* (2013.01); *H01L 24/03* (2013.01); *H01L 24/08* (2013.01); *H01L 24/80* (2013.01);
(Continued)

(58) Field of Classification Search
CPC ........................ H01L 2224/0345–0822; H01L 2224/80203–80805; H01L 24/03–08; H01L 24/80; H01L 25/167
See application file for complete search history.

(56) References Cited

U.S. PATENT DOCUMENTS

2017/0323873 A1* 11/2017 Lin .................. H01L 24/05
2019/0171318 A1 6/2019 Ryu
(Continued)

FOREIGN PATENT DOCUMENTS

CN 105575275 A 5/2016
CN 110491852 A 11/2019
(Continued)

OTHER PUBLICATIONS

International Search Report in International application No. PCT/CN2021/138736, mailed on Apr. 27, 2022.
(Continued)

*Primary Examiner* — Hoa B Trinh
(74) *Attorney, Agent, or Firm* — PV IP PC; Wei Te Chung (57) ABSTRACT

A display panel, a method of manufacturing the display panel, and a display device are provided. According to the display panel provided by the embodiment of the present application, a bonding structure is arranged between a display substrate and a circuit board to connect the display substrate and the circuit board together, and a width of the bonding structure is set to be 50 microns (μm)-200 μm, so that when a plurality of display panels are spliced to realize
(Continued)

a large-screen display, a width of an interval area between the adjacent display areas of the display panels may be significantly reduced.

6 Claims, 3 Drawing Sheets

(52) U.S. Cl.
CPC .... *H01L 25/167* (2013.01); *H01L 2224/0345* (2013.01); *H01L 2224/0508* (2013.01); *H01L 2224/05144* (2013.01); *H01L 2224/05147* (2013.01); *H01L 2224/05166* (2013.01); *H01L 2224/0518* (2013.01); *H01L 2224/05573* (2013.01); *H01L 2224/05609* (2013.01); *H01L 2224/08225* (2013.01); *H01L 2224/80203* (2013.01); *H01L 2224/80805* (2013.01)

(56) References Cited

U.S. PATENT DOCUMENTS

2021/0358875 A1* 11/2021 Lee .................... H01L 24/92
2022/0231079 A1* 7/2022 Lee .................... H01L 23/60

FOREIGN PATENT DOCUMENTS

| CN | 110707121 A | 1/2020 |
| CN | 111128022 A | 5/2020 |
| CN | 211604089 U | 9/2020 |
| CN | 112599535 A | 4/2021 |
| CN | 112859460 A | 5/2021 |
| JP | 2002009231 A | 1/2002 |

OTHER PUBLICATIONS

Written Opinion of the International Search Authority in International application No. PCT/CN2021/138736, mailed on Apr. 27, 2022.
Chinese Office Action issued in corresponding Chinese Patent Application No. 202111460450.5 dated Aug. 31, 2022, pp. 1-6.
Chinese Office Action issued in corresponding Chinese Patent Application No. 202111460450.5 dated May 18, 2023, pp. 1-4.
Chinese Decision of Rejection issued in corresponding Chinese Patent Application No. 202111460450.5 dated Jul. 25, 2023, pp. 1-6.

\* cited by examiner

DISPLAY PANEL, METHOD OF MANUFACTURING DISPLAY PANEL, AND DISPLAY DEVICE

BACKGROUND OF INVENTION

1. Field of Invention

The present application relates to a technical field of displays, and more particularly, to a display panel, a method of manufacturing the display panel, and a display device.

2. Related Art

Light-emitting diode (LED) display screens have characteristics of high brightness, strong environmental adaptability, long service life, and so on, and are therefore more and more favored by users. When larger display screens are needed, several small LED display screens may be spliced to form larger display screens.

Since an edge of each small-sized LED display screen is provided with a bonding structure for connecting a circuit board, when a width of the bonding structure is relatively large, there will be a large gap between display areas of adjacent LED display screens after splicing, which will significantly affect the display effect of the spliced screen. Therefore, how to reduce the width of the bonding structure at the edge of each small LED display screen is an urgent technical problem to be solved.

SUMMARY OF INVENTION

Embodiments of the present invention provide a display panel, a method of manufacturing the display panel, and a display device. The bonding structure in the display panel can realize the firm connection between a display substrate and a circuit board while keeping the small width of the bonding structure. In addition, when the display panel is used for splicing display, the display effect of a spliced display screen may be significantly improved.

In a first aspect, an embodiment of the present application provides a display panel, comprising a display substrate on which a display area and a first bonding area located at a periphery of the display area are defined; and a circuit board on which a second bonding area is defined. The first bonding area of the display substrate and the second bonding area of the circuit board are connected by a bonding structure, and a width of the bonding structure ranging from 50 (microns) gin to 200 μm.

In some embodiments, the bonding structure comprises a first metal layer, a second metal layer, and a third metal layer which are stacked in sequence, wherein the first metal layer is connected with the display substrate, the third metal layer is connected with the circuit board, a junction of the first metal layer and the second metal layer forms a eutectic bonding structure, and a junction of the third metal layer and the second metal layer forms a eutectic bonding structure.

In some embodiments, a melting point of the first metal layer, and a melting point of the third metal layer are both higher than a melting point of the second metal layer.

In some embodiments, the first metal layer and the device, third metal layer are made of gold, and the second metal layer is made of indium.

In a second aspect, the embodiment of the present application provides a method of manufacturing a display panel, comprising acquiring a display substrate, wherein a display area and a first bonding area located at a periphery of the display area are defined on the display substrate; acquiring a circuit board, wherein a second bonding area is defined on the circuit board; and forming a bonding structure between the first bonding area of the display substrate and the second bonding area of the circuit board to connect the display substrate with the circuit board, wherein a width of the bonding structure is 50 μm-200 μm.

In some embodiments, the first bonding area of the display substrate is provided with a first metal layer and a second metal layer which are sequentially stacked. A third metal layer is arranged in the second bonding area of the circuit board. Forming a bonding structure between the first bonding area of the display substrate and the second bonding area of the circuit board comprises binding the third metal layer with the second metal layer; and heating the first metal layer, the second metal layer, and the third metal layer, and simultaneously applying pressures to the first metal layer, the second metal layer, and the third metal layer, so that a eutectic bonding structure is formed at a junction of the first metal layer and the second metal layer, and a eutectic bonding structure is formed at a junction of the third metal layer and the second metal layer.

In some embodiments, a melting point of the first metal layer and a melting point of the third metal layer are both higher than a melting point of the second metal layer.

In some embodiments, the first metal layer and the third metal layer are made of gold, and the second metal layer is made of indium.

In some embodiments, the heating the first metal layer, the second metal layer, and the third metal layer, and simultaneously applying pressures to the first metal layer, the second metal layer, and the third metal layer comprises heating the first metal layer, the second metal layer, and the third metal layer until temperatures of the first metal layer, the second metal layer, and the third metal layer are all 180° C.-200° C., and pressures applied to the first metal layer, the second metal layer, and the third metal layer are 0.5 megapascals (Mpa)-1.5 Mpa, wherein durations of heating and applying the pressures to the first metal layer, the second metal layer, and the third metal layer are 90 seconds (s)-200 s.

In some embodiments, an area of the first metal layer and an area of the third metal layer are both larger than that of the second metal layer.

In some embodiments, a thickness of the first metal layer is 450 nanometers (nm)-550 nm, a thickness of the second metal layer is 250 nm-350 nm, and a thickness of the third metal layer is 40 nm-60 nm.

In some embodiments, the acquiring the display substrate comprises providing a driving substrate comprising a substrate, a thin-film transistor (TFT) layer and a connecting layer, wherein the TFT layer and the connecting layer are arranged on the substrate and spaced apart from each other; wherein a display area and a first bonding area located at a periphery of the display area are defined on the driving substrate, the TFT layer is located in the display area, and the connecting layer is located in the first bonding area; providing a plurality of light emitting units on the display area of the driving substrate, so that the plurality of light emitting units are electrically connected with the TFT layer; and sequentially forming a first metal layer and a second metal layer on a side of the connecting layer away from the substrate.

In some embodiments, the connecting layer comprises a first metal composite layer and a second metal composite layer stacked together; the first metal composite layer comprises a first molybdenum layer, a first titanium layer, and a first copper layer which are sequentially stacked on the substrate; and the second metal composite layer comprises a second molybdenum layer, a second titanium layer, and a second copper layer which are sequentially stacked on the first metal composite layer.

In some embodiments, the manufacturing method further comprises coating encapsulation glue on a periphery of the bonding structure, and curing the encapsulation glue, wherein the bonding structure comprises the first metal layer, the second metal layer, and the third metal layer which are sequentially stacked.

In some embodiments, the manufacturing method further comprises annealing the bonding structure.

In some embodiments, a temperature of annealing the bonding structure is 150° C.-200° C., and a duration of preserving heat is 100 minutes (min)-150 min.

In some embodiments, a first metal layer is disposed in the first bonding area of the display substrate; the second bonding area of the circuit board is provided with a third metal layer and a second metal layer which are sequentially stacked; the forming a bonding structure between the first bonding area of the display substrate and the second bonding area of the circuit board comprises: binding the second metal layer with the first metal layer; and heating the first metal layer, the second metal layer, and the third metal layer, and simultaneously applying pressures to the first metal layer, the second metal layer, and the third metal layer, so that a eutectic bonding structure is formed at a junction of the first metal layer and the second metal layer, and a eutectic bonding structure is formed at a junction of the third metal layer and the second metal layer.

In a fourth aspect, an embodiment of the present application provides a display device, which comprises the aforementioned display panel or the display panel manufactured by the aforementioned manufacturing method.

The present application has advantageous effects as follows: according to the display panel provided by the embodiment of the present application, the bonding structure is arranged between the display substrate and the circuit board to connect the display substrate and the circuit board together, and the width of the bonding structure is set to be 50 μm-200 μm. When a plurality of display panels are spliced to realize a large-screen display, the width of the interval areas between the display areas of adjacent display panels may be significantly reduced, thereby improving the display effect of the spliced screen.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments acquired by those skilled in the art without creative efforts shall be within the scope of the present application.

Figure 1:
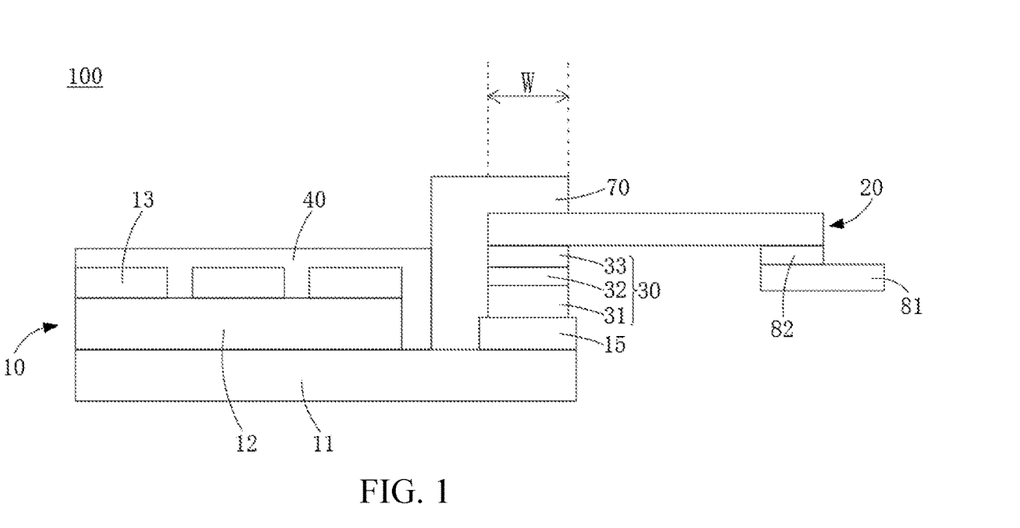
FIG. 1 is a schematic structural diagram illustrating a display panel according to an embodiment of the present application.

Please refer to FIG. 1, which is a diagram illustrating the structure of a display panel according to an embodiment of the present application. The embodiment of the present application provides a display panel 100, which includes a display substrate 10 and a circuit board 20 which are connected. The display substrate 10 defines a display area and a first bonding area located at a periphery of the display area, and the circuit board 20 defines a second bonding area. Among them, the first bonding area of the display substrate 10 and the second bonding area of the circuit board 20 are connected by a bonding structure 30, and a width of the bonding structure 30 is 50 microns (μm)-200 μm.

It should be noted that in the embodiment of the present application, the width of the bonding structure 30 refers to an outer lead bonding (OLB) pitch.

In the display panel 100 provided in this embodiment, the bonding structure 30 is arranged between the display substrate 10 and the circuit board to connect the display substrate 10 and the circuit board 20 together, and the width of the bonding structure 30 is 50 μm-200 μm. In this way, when a plurality of display panels 100 are spliced to realize a large-screen display, the width of the areas spaced between the display areas of adjacent display panels 100 may be significantly reduced, thereby improving the display effect of the spliced screen.

Illustratively, the bonding structure 30 includes a first metal layer 31, a second metal layer 32, and a third metal layer 33 which are stacked in sequence, wherein the first metal layer 31 is connected with the display substrate 10, and the third metal layer 33 is connected with the circuit board A junction of the first metal layer 31 and the second metal layer 32 forms a eutectic bonding structure, and a junction of the third metal layer 33 and the second metal layer 32 forms a eutectic bonding structure.

It should be noted that the term eutectic bonding means that when two metals that can form eutectic at the eutectic temperature contact with each other, after mutual diffusion, a liquid alloy with eutectic composition may be formed therebetween. As time goes on, the liquid layer becomes thicker. Later after cooling, the two kinds of metals are alternately precipitated in the liquid layer, and each kind of the metals grows and be crystallized based on its original solid phase, and thus the eutectic between the two metals can closely combine the two metals.

It may be understood that the eutectic bonding structure has relatively high tensile strength and is thus not easy to break, so that the bonding structure 30 can firmly connect the display substrate 10 and the circuit board 20 while keeping a small width.

In some embodiments, a melting point of the first metal layer 31 and a melting point of the third metal layer 33 are both higher than that of the second metal layer 32. For example, a material of the first metal layer 31 and a material of the third metal layer 33 may both be gold (Au), and a material of the second metal layer 32 may be indium (In).

Referring to FIG. 1, in the display panel 100 of the embodiment of the present application, because the bonding structure 30 adopts a eutectic bonding process and thus has relatively high tensile strength, a width w of the bonding structure 30 can achieve between 50 μm-200 μm (e.g., 50 μm, 70 μm, 90 μm, 110 μm, 130 μm, 150 μm, 170 μm, 200 μm, etc.), and the bonding structure 30 in the embodiment of the present application can also have a larger width range, such as from 50 μm-350 μm (e.g., 50 μm, 100 μm, 160 μm, 210 μm, 250 μm, 300 μm, 350 μm, etc.).

In prior art, the display substrate and the circuit board are connected via an anisotropic conductive film (ACF), and a width of a bonding structure is relatively large due to the adhesive overflow in the ACF. Comparatively, by connecting the display substrate and the circuit board together by eutectic bonding, the present application can greatly improve the connection stability between the display substrate and the circuit board without the problem of adhesive overflow. The bonding structure in the embodiment of the present application can achieve a narrower width, so as to facilitate the realization of spliced display.

In some embodiments, the circuit board 20 may be a chip on film (COF).

Referring to FIG. 1, the display substrate 10 may include a substrate 11, and a thin-film transistor (TFT) layer 12 and a connecting layer which are spaced apart on the substrate 11. The TFT layer 12 is located in the display area, and the connecting layer 15 is located in the first bonding area.

In some embodiments, the connecting layer 15 may include a first metal composite layer and a second metal composite layer which are stacked. The first metal composite layer includes a first molybdenum layer, a first titanium layer, and a first copper layer which are sequentially stacked on the substrate 11. The second metal composite layer includes a second molybdenum layer, a second titanium layer, and a second copper layer which are sequentially stacked on the first metal composite layer.

For example, a thickness of the first molybdenum layer and a thickness of the second molybdenum layer may both be 4 nanometers (nm)-6 nm (e.g., 4 nm, 5 nm, 6 nm, etc.). The thickness of the first titanium layer and the thickness of the second titanium layer may both be 16 nm-24 nm (e.g., 16 nm, 18 nm, 20 nm, 22 nm, 24 nm, etc.). The thickness of the first copper layer and the second copper layer may both be 400 nm-800 nm (e.g., 400 nm, 500 nm, 600 nm, 700 nm, 800 nm, etc.).

Referring to FIG. 1, the display substrate 10 may further include a plurality of light emitting units 13 disposed on the TFT layer 12, and all of the light emitting units 13 are electrically connected with the TFT layer 12. In some embodiments, each light emitting unit 13 may be an LED chip. Illustratively, the plurality of light emitting units 13 may include red light emitting units, green light emitting units, blue light emitting units, etc.

Referring to FIG. 1, the display substrate 10 may further include a protective adhesive 14 covering outer surfaces of a plurality of light emitting units 13. It may be understood that the protective adhesive 14 is a transparent adhesive layer.

Referring to FIG. 1, the display substrate 10 may further include an encapsulant 70 disposed on the periphery of the bonding structure 30. For example, the encapsulation adhesive 70 can encapsulate a side surface of the bonding structure 30 and an area on the outer surface of the circuit board 20 that corresponds to the bonding structure 30. It may be understood that the outer surface of the circuit board 20 refers to the surface of the side of the circuit board 20 away from the bonding structure 30.

Referring to FIG. 1, the display substrate 10 may further include a control circuit board 81, and the circuit board 20 is electrically connected with the control circuit board 81. For example, the circuit board 20 and the control circuit board 81 may be connected via an anisotropic conductive film 82. For example, the control circuit board 81 may be a printed circuit board (PCB). It may be understood that when a plurality of display substrates 10 are spliced to form a large screen, the circuit board 20 needs to be bent, so that an end of the circuit board 20 where the control circuit board 81 is located is bent to the side of the display substrate 10 away from the bonding structure 30.

Figure 2:
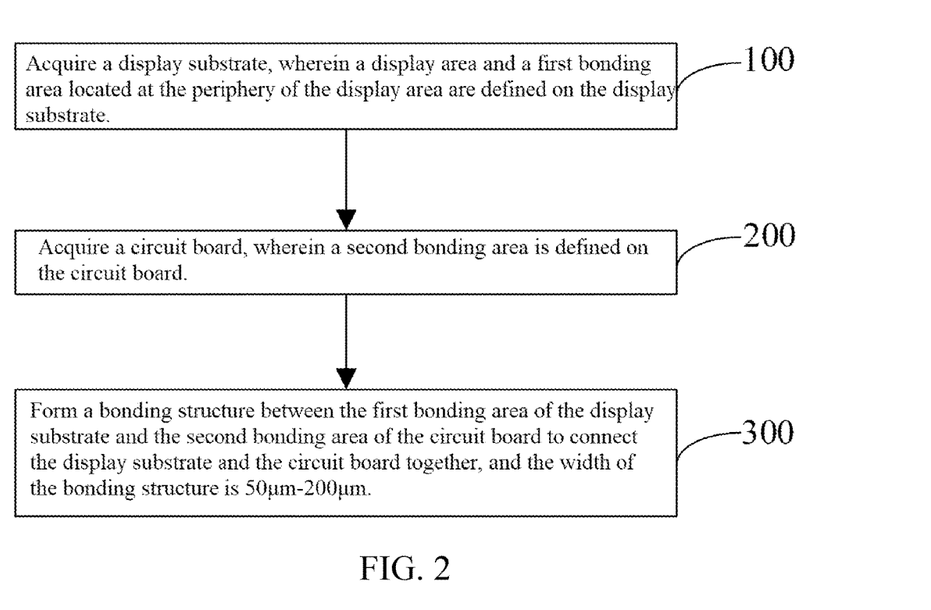
FIG. 2 is a flowchart illustrating a method of manufacturing a display panel provided by an embodiment of the present application.

Please refer to FIG. 2 along with FIG. 1. FIG. 2 is a flowchart illustrating a method of manufacturing a display panel provided by an embodiment of the present application. This embodiment of the present application further provides a method of manufacturing the display panel, which may be used to manufacture the display panel 100 in any of the above embodiments, and the manufacturing method may include following steps:

100: acquire a display substrate 10, wherein a display area and a first bonding area located at the periphery of the display area are defined on the display substrate 10;

200: acquire a circuit board 20, wherein a second bonding area is defined on the circuit board 20; and 300: form a bonding structure 30 between the first bonding area of the display substrate 10 and the second bonding area of the circuit board 20 to connect the display substrate 10 and the circuit board 20 together, and the width of the bonding structure 30 is 50 μm-200 μm.

Figure 3:
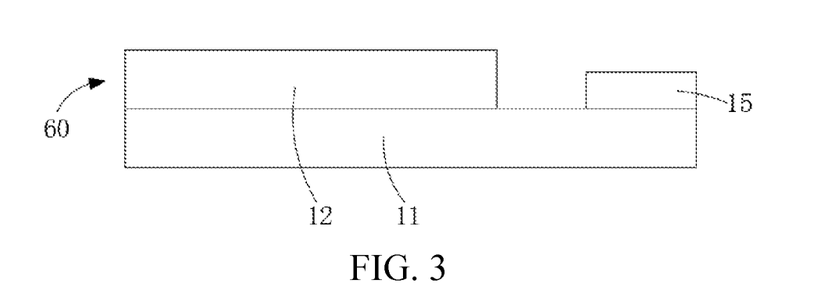
FIG. 3 is a schematic structural diagram illustrating a driving substrate according to an embodiment of the present application.

Please refer to FIG. 3, which is a diagram illustrating the structure of a driving substrate according to an embodiment of the present application. The step of acquiring a display substrate may specifically include: 110: providing a driving substrate 60, wherein the driving substrate 60 includes a substrate 11, a TFT layer 12 and a connecting layer 15 which are spaced apart on the substrate 11; a display area and a first bonding area located at the periphery of the display area are defined on the driving substrate 60; the TFT layer 12 is located in the display area; and the connecting layer 15 is located in the first bonding area.

It should be noted that the connecting layer 15 and the TFT layer 12 may be formed in a same process, and materials used in the connecting layer 15 may be those used in the manufacturing process of the TFT layer 12, such as molybdenum, titanium, copper, etc. In the embodiment of the present application, the connecting layer 15 may be used not only as a diffusion barrier layer for eutectic bonding reaction, but also as an adhesion layer between the bonding structure 30 and the substrate 11 of the display substrate 10.

In some embodiments, the connecting layer 15 may include a first metal composite layer and a second metal composite layer which are stacked. The first metal composite layer includes a first molybdenum layer, a first titanium layer, and a first copper layer which are sequentially stacked on the substrate 11. The second metal composite layer includes a second molybdenum layer, a second titanium layer, and a second copper layer which are sequentially stacked on the first metal composite layer.

For example, a thickness of the first molybdenum layer and the thickness of a second molybdenum layer may both be 4 nm-6 nm (e.g., 4 nm, 5 nm, 6 nm, etc.), a thickness of the first titanium layer and the thickness of the second titanium layer may both be 16 nm-24 nm (e.g., 16 nm, 18 nm, 20 nm, 22 nm, 24 nm, etc.), and a thickness of the first copper layer and the second copper layer may both be 400 nm-800 nm (e.g., 400 nm, 500 nm, 600 nm, 700 nm, 800 nm, etc.).

Figure 4:
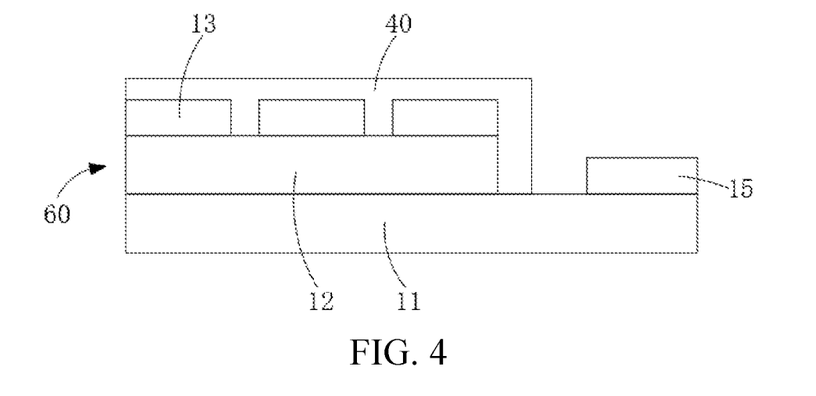
FIG. 4 is a diagram illustrating light emitting units and protective glue disposed in a display area of the driving substrate according to the embodiment of the present application.

Please refer to FIG. 4, which is a diagram illustrating setting light emitting units and protective glue in the display area of the driving substrate according to the embodiment of the present application. Specifically, the step of acquiring the display substrate may further include: 120: arranging a plurality of light emitting units 13 on the TFT layer 12, so that the plurality of light emitting units 13 are electrically connected with the TFT layer 12.

In some embodiments, the light emitting unit 13 may be an LED chip.

Referring to FIG. 4. Specifically, the step of "acquiring the display substrate 10" may further include: 130: coat the protective glue 14 on the outer surfaces of the plurality of light emitting units 13.

It may be understood that the protective adhesive 14 may be a transparent adhesive layer.

Figure 5:
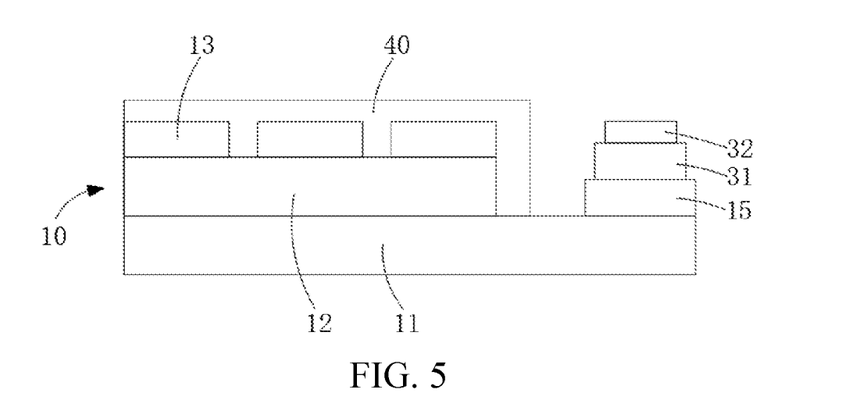
FIG. 5 is a diagram illustrating a first metal layer and a second metal layer in the first bonding area of the driving substrate according to an embodiment of the present application.

Please refer to FIG. 5, which is a diagram illustrating setting a first metal layer and a second metal layer in the first bonding area of the driving substrate according to an embodiment of the present application. Specifically, the step of acquiring the display substrate may further include: 140: sequentially form the first metal layer 31 and the second metal layer 32 on a side of the connecting layer 15 away from the substrate 11.

For example, both the first metal layer 31 and the second metal layer 32 may be manufactured using a physical vapor deposition (PVD) process.

Figure 6:
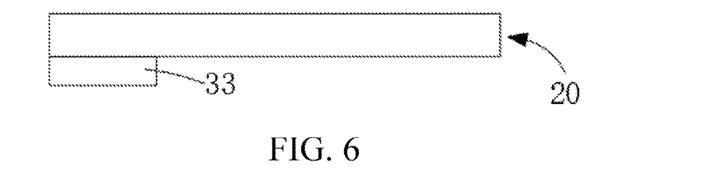
FIG. 6 is a schematic structural diagram illustrating a circuit board according to an embodiment of the present application.

Please refer to FIG. 6, which is a diagram illustrating the structure of a circuit board according to an embodiment of the present application. A third metal layer 33 may be provided in the second bonding area of the circuit board 20.

In some embodiments, a melting point of the first metal layer 31 and a melting point of the third metal layer 33 may be both higher than that of the second metal layer 32. For example, the material of the first metal layer 31 and the material of the third metal layer 33 may both be gold, and the material of the second metal layer 32 may be indium.

Referring to FIG. 6, in the circuit board 20, a copper layer may be arranged between the third metal layer 33 (e.g., a gold layer) and a main body of the circuit board 20, which can reduce a thickness of the third metal layer 33 (e.g., gold layer) and reduce the cost. While in other embodiments, the circuit board 20 may not be provided with a copper layer, and in this way the third metal layer 33 (e.g., gold layer) needs to keep a larger thickness.

Figure 7:
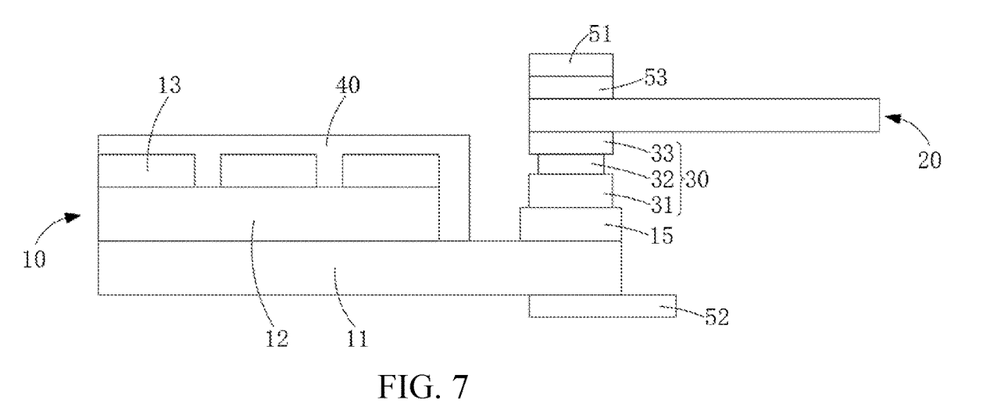
FIG. 7 is a diagram illustrating a display substrate and a circuit board pressed together according to an embodiment of the present application.

Please refer to FIG. 7, which is a diagram illustrating pressing a display substrate and a circuit board according to an embodiment of the present application. When the first bonding area of the display substrate 10 is provided with sequentially stacked first metal layer 31 and second metal layer 32, and the second bonding area of the circuit board 20 is provided with the third metal layer 33, the step of "forming the bonding structure 30 between the first bonding area of the display substrate 10 and the second bonding area of the circuit board 20" may specifically include:

310: bind the third metal layer 33 and the second metal layer 32 together.

320: heat the first metal layer 31, the second metal layer 32, and the third metal layer 33, and simultaneously apply pressure to the first metal layer 31, the second metal layer 32, and the third metal layer 33, so that the junction of the first metal layer 31 and the second metal layer 32 forms a eutectic bonding structure, and the junction of the third metal layer 33 and the second metal layer 32 also forms a eutectic bonding structure.

It should be noted that when the material of the first metal layer 31 and the material of the third metal layer 33 are both gold (Au) and the material of the second metal layer 32 is indium (In), the eutectic bonding reaction between Au and In can occur at a low temperature (under the premise that the mass ratio of Au to In is 1:1 to 2:1) to generate the intermetallic compound AuIn2. That is, eutectic bonding structures may be formed at the junction of the first metal layer 31 and the second metal layer 32 and the junction of the third metal layer 33 and the second metal layer 32, so that the first metal layer 31, the second metal layer 32, and the third metal layer 33 may be tightly combined together. The theoretical tensile strength of the Au—In eutectic bonding structure can reach 900 N/m, so that the bonding structure 30 can have better structural stability.

When the material of the first metal layer 31 and the material of the third metal layer 33 are both gold and the material of the second metal layer 32 is indium, the step of "heating the first metal layer 31, the second metal layer 32, and the third metal layer 33, and simultaneously applying pressure to the first metal layer 31, the second metal layer 32, and the third metal layer 33" may specifically include: heating each of the first metal layer 31, the second metal layer 32, and the third metal layer 33 to a temperature of 180° C.-200° C. (e.g., 180° C., 183° C., 185° C., 187° C., 190° C., 192° C., 194° C., 196° C., 198° C., 200° C., etc.), wherein the pressure applied to each of the first metal layer 31, the second metal layer 32, and the third metal layer 33 may be 0.5 megapascals (Mpa)-1.5 Mpa pa (e.g., 0.5 Mpa, 0.7 Mpa, 1 Mpa, 1.2 Mpa, 1.4 Mpa, 1.5 Mpa, etc.), and both the durations for heating and applying pressure may be 90 seconds (s)-200 s (e.g., 90 s, 100 s, 110 s, 120 s, 130 s, 140 s, 150 s, 160 s, 170 s, 180 s, 190 s, 200 s, etc.).

As can be seen form the above that the heating temperature of 180° C.-200° C. adopted in the embodiment of the present application is a relatively low temperature range, so that the driving circuit and LED chip in the display substrate 10 may be protected from high temperature which can damage the driving circuit and LED chip in the display substrate 10. In addition, the lower temperature is more suitable for application in actual manufacturing to have lower production cost.

In some embodiments, an area of the first metal layer 31 and an area of the third metal layer 33 are both larger than that of the second metal layer 32.

It may be understood that in the process of heating the first metal layer 31, the second metal layer 32, and the third metal layer 33, because the melting point of the second metal layer 32 is relatively low, it will melt first in the heating process, and the melted second metal layer 32 will undergo eutectic bonding reaction with the first metal layer 31 and the third metal layer 33, respectively, forming eutectic bonding structures. Therefore, by designing the area of the second metal layer 32 to be smaller than those of the first metal layer 31 and the third metal layer 33, when the area of the second metal layer 32 is enlarged due to melting, the problem of the melted second metal layer 32 flowing to other areas of the display substrate 10 can be prevented, thus improving the process yield.

Referring to FIG. 7, the step of "heating the first metal layer 31, the second metal layer 32, and the third metal layer 33 while simultaneously applying pressure to the first metal layer 31, the second metal layer 32, and the third metal layer 33" may be realized by the following technical approaches: applying pressure to the first metal layer 31, the second metal layer 32, and the third metal layer 33 from the side of the circuit board 20 away from the third metal layer 33 by using a indenter 51, Meanwhile, the first metal layer 31, the second metal layer 32, and the third metal layer 33 may be heated by the heat from the indenter 51. The temperature of the indenter 51 may be 280° C.-320° C. (e.g., 280° C., 290° C., 300° C., 310° C., 320° C., etc.), and a buffer material 53 (e.g., silicone tape) may be arranged between the indenter 51 and the circuit board 20 to prevent the circuit board 20 from being damaged in the process of pressing. Because the process of transferring heat from the indenter 51 to the first metal layer 31, the second metal layer 32, and the third metal layer 33 needs to pass through the buffer material 53 and the circuit board 20, a part of the heat is meant be lost, thus the temperature of the indenter 51 needs to be set at a higher temperature. The inventor of the present application found through experiments that when the temperature of the indenter 51 is set at 280° C.-320° C., each of the first metal layer 31, the second metal layer 31, and the second metal layer 33 may reach 180° C.-200° C. In addition, when the indenter 51 is used to apply pressure to the circuit board 20, a pressure holder 52 may be arranged on the side of the display substrate 10 away from the first metal layer 31 to cooperate with the indenter 51 to press the first metal layer 31, the second metal layer 32, and the third metal layer 33.

For example, the first metal layer 31, the second metal layer 32, and the third metal layer 33 may all be square, each of a side length of the first metal layer 31 and a side length of the third metal layer 33 may be 35 μm-45 μm (e.g., 35 μm, 37 μm, 40 μm, 43 μm, 45 μm, etc.), and the side length of the second metal layer 32 may be 15 μm-25 μm (e.g., 15 μm, 17 μm, 20 μm, 23 μm, 25 μm, etc.).

In some embodiments, the thickness of the first metal layer 31 may be 450 nm-550 nm (e.g., 450 nm, 470 nm, 500 nm, 520 nm, 550 nm, etc.), and the thickness of the second metal layer 32 may be 250 nm-350 nm (e.g., 250 nm, 280 nm, 300 nm, 330 nm, 350 nm, etc.).

Figure 8:
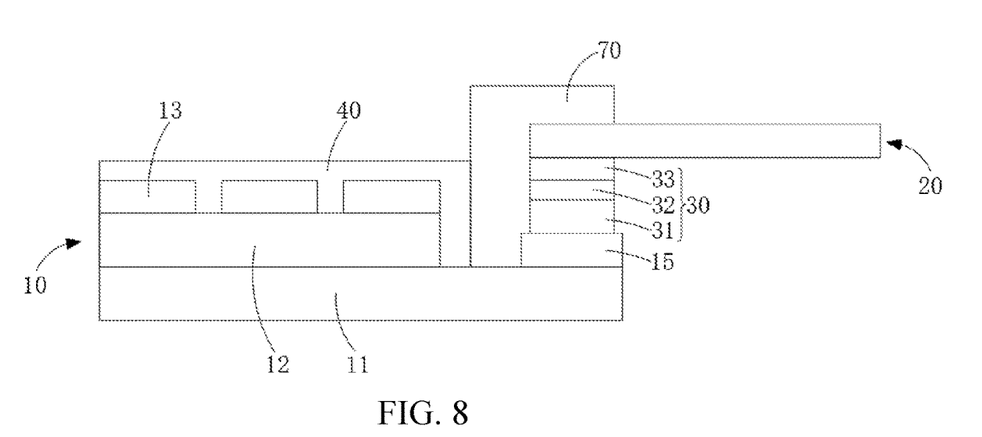
FIG. 8 is a diagram illustrating encapsulation glue coated on a periphery of a bonding structure according to the embodiment of the present application.

Please refer to FIG. 8, which is a schematic diagram of coating encapsulation glue on the periphery of the bonding structure according to the embodiment of the present application. The manufacturing method of the display panel may further include: 400: coat an encapsulation glue 70 on the periphery of the bonding structure 30, and cure the encapsulation glue 70, wherein the bonding structure 30 includes the first metal layer 31, the second metal layer 32, and the third metal layer 33 which are sequentially stacked.

The encapsulation adhesive 70 can cover the side surface of the bonding structure 30 and the area on the outer surface of the circuit board 20 that corresponds to the bonding structure 30. It may be understood that the outer surface of the circuit board 20 refers to the surface of the side of the circuit board 20 away from the bonding structure 30.

In some embodiments, the encapsulating adhesive 70 may be ultraviolet (UV) adhesive, and the encapsulating adhesive 70 may be cured using ultraviolet irradiation.

The method of manufacturing the display panel may further include: 600: anneal the bonding structure 30.

For example, an annealing temperature may be 150° C.-200° C., and a duration of preserving temperature may be 100 min-150 min.

Referring to FIG. 1, the method of manufacturing the display panel may further include: providing a control circuit board 81, so that the circuit board 20 is electrically connected with the control circuit board 81.

In some embodiments, the circuit board 20 and the control circuit board 81 may be electrically connected by arranging an anisotropic conductive film 82 between the circuit board 20 and the control circuit board 81.

For example, the control circuit board 81 may be a printed circuit board.

Referring to FIG. 8, in some embodiments, when the first metal layer 31 is arranged in the first bonding area of the display substrate 10, and the third metal layer 33 and the second metal layer 32 are sequentially arranged in the second bonding area of the circuit board 20, the step of "forming the bonding structure 30 between the first bonding area of the display substrate 10 and the second bonding area of the circuit board 20" can specifically include:

310': bind the second metal layer 32 and the first metal layer 31 together.

320': heat the first metal layer 31, the second metal layer 32, and the third metal layer 33, and simultaneously apply pressures to the first metal layer 31, the second metal layer 32, and the third metal layer 33, so that a eutectic bonding structure is formed at the junction of the first metal layer 31 and the second metal layer 32, and a eutectic bonding structure is formed at the junction of the third metal layer 33 and the second metal layer 32.

The embodiment of the present application further provides a display device including the display panel 100 of any of the above embodiments or the display panel 100 manufactured using the manufacturing method of any of the above embodiments.

Illustratively, the display device may be a television (TV), a mobile phone, a tablet computer, a computer monitor, a game device, a wearable device and other devices with a display screen, wherein the wearable devices may be smart bracelets, smart glasses, smart watches, smart decorations, etc.

The display panel, the method of manufacturing the display panel and the display device provided by the embodiment of the present application are described in detail above. In this application, specific examples are used to explain the principle and implementation of the present application, and the descriptions of the above examples are merely used to facilitate the comprehension of the present application. Meanwhile, some modification, some modifications may be made to the implementation and applied fields by one skilled in the art based on the concept of the present application. To sum up, the content of the specification should not be interpreted as a limitation of the scope of the present application.

What is claimed is:
1. A display panel, comprising:
a display substrate on which a display area and a first bonding area located at a periphery of the display area are defined; and a circuit board on which a second bonding area is defined;

wherein the first bonding area of the display substrate and the second bonding area of the circuit board are connected by a bonding structure, and a width of the bonding structure ranging from 50 (microns) μm to 200 μm;

wherein the bonding structure comprises a first metal layer, a second metal layer, and a third metal layer which are stacked in sequence, cross-sections of the first metal layer, the second metal layer and the third metal layer are all in a rectangular shape; the first metal layer has a top surface and a bottom surface, the second metal layer has a top surface and a bottom surface, and the top surface of the first metal layer and the bottom surface of the second metal layer are coplanar;

wherein the display substrate comprises a substrate, and a thin-film transistor (TFT) layer and a connecting layer which are spaced apart on the substrate, the TFT layer is located in the display area, and the connecting layer is located in the first bonding area, the connecting layer comprises a first metal composite layer and a second metal composite layer which are stacked.

2. The display panel of claim 1, wherein the first metal layer is connected with the display substrate, the third metal layer is connected with the circuit board, a junction of the first metal layer and the second metal layer forms a eutectic bonding structure, and a junction of the third metal layer and the second metal layer forms a eutectic bonding structure.

3. The display panel of claim 2, wherein a melting point of the first metal layer, and a melting point of the third metal layer are both higher than a melting point of the second metal layer.

4. The display panel of claim 3, wherein the first metal layer and third metal layer are made of gold, and the second metal layer is made of indium.

5. The display panel of claim 2, wherein a thickness of the first metal layer is 450 nanometers (nm)-550 nm, a thickness of the second metal layer is 250 nm-350 nm, and a thickness of the third metal layer is 40 nm-60 nm.

6. A display device, comprising the display panel of claim 1.

* * * * *